(12) United States Patent
Cho et al.

(10) Patent No.: US 8,883,398 B2
(45) Date of Patent: Nov. 11, 2014

(54) PHOTOACTIVE COMPOUND AND LIGHT-SENSITIVE RESIN COMPOSITION COMPRISING SAME

(71) Applicant: LG Chem, Ltd., Seoul (KR)

(72) Inventors: Changho Cho, Daejeon (KR); Sunghyun Kim, Daejeon (KR); Han Soo Kim, Daejeon (KR); Sunhwa Kim, Daejeon (KR); Raisa Kharbash, Daejeon (KR); Jongho Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/347,165

(22) PCT Filed: May 22, 2013

(86) PCT No.: PCT/KR2013/004496
§ 371 (c)(1),
(2), (4) Date: Mar. 25, 2014

(87) PCT Pub. No.: WO2013/180419
PCT Pub. Date: Dec. 5, 2013

(65) Prior Publication Data
US 2014/0234774 A1    Aug. 21, 2014

(30) Foreign Application Priority Data

May 30, 2012  (KR) .................. 10-2012-0057757
May 14, 2013  (KR) .................. 10-2013-0054473

(51) Int. Cl.
*G03F 7/004* (2006.01)
*G03F 7/028* (2006.01)
*C07D 209/82* (2006.01)

(52) U.S. Cl.
USPC .................. 430/270.1; 430/281.1; 430/285.1; 430/322; 430/325; 430/326; 430/330; 430/331; 430/905; 548/440

(58) Field of Classification Search
USPC ........ 430/270.1, 281.1, 285.1, 330, 331, 322, 430/326, 325, 905, 926; 548/440
See application file for complete search history.

(56) References Cited

U.S. PATENT DOCUMENTS

| | | | |
|---|---|---|---|
| 4,507,251 A | 3/1985 | Soriano et al. | |
| 8,168,369 B2 * | 5/2012 | Cho et al. | 430/270.1 |
| 2011/0129778 A1 | 6/2011 | Murata et al. | |
| 2011/0318692 A1 | 12/2011 | Cho et al. | |

FOREIGN PATENT DOCUMENTS

| | | |
|---|---|---|
| EP | 2433927 A1 | 3/2012 |
| JP | 61-118423 A | 6/1986 |
| JP | 2011-141413 A | 7/2011 |
| KR | 10-2008-0104287 A | 12/2008 |
| KR | 10-2010-0092904 A | 8/2010 |
| KR | 10-2011-0059525 A | 6/2011 |
| KR | 10-2011-0085005 A | 7/2011 |
| WO | 2005/080337 A1 | 9/2005 |
| WO | 2011/093479 A1 | 8/2011 |

OTHER PUBLICATIONS

Office Action issued in Taiwanese Patent Appln. No. 102118306 on Jun. 18, 2014 along with English translation, 10 pages.

* cited by examiner

*Primary Examiner* — Amanda C. Walke
(74) *Attorney, Agent, or Firm* — Rothwell, Figg, Ernst & Manbeck, P.C.

(57) ABSTRACT

The present application relates to a photoactive compound including an oxime ester group and a phosphonate group together, and a photosensitive resin composition comprising the same, the compound of the present application having excellent storage stability and high-temperature process characteristics.

21 Claims, No Drawings

PHOTOACTIVE COMPOUND AND LIGHT-SENSITIVE RESIN COMPOSITION COMPRISING SAME

CROSS REFERENCE TO RELATED APPLICATIONS

This application is a 35 U.S.C. §371 National Phase Entry Application from PCT/KR2013/004496, filed May 22, 2013, and designating the United States, which claims priority under 35 U.S.C. §119 to Korean Patent Application No. 10-2012-0057757 filed May 30, 2012 and to Korean Patent Application No. 10-2013-0054473 filed May 14, 2013, which are incorporated herein in their entireties.

FIELD OF THE INVENTION

The present application relates to a photoactive compound including an oxime ester group and a phosphonate group, and a photosensitive resin composition comprising the same.

BACKGROUND OF THE INVENTION

The present application relates to a photoactive compound including an oxime ester group and a phosphonate group, and a photosensitive resin composition comprising the same.

Photosensitive resin compositions may be used in forming a pattern by being applied on a substrate to form a coated film, and, after exposure by light irradiation is performed on a certain part of this coated film using a photomask and the like, the non-exposed area being removed using development. These photosensitive resin compositions are used in photocurable inks, photosensitive printing plates, various photoresists, color filter photoresists for an LCD, photoresists for a resin black matrix, or transparent photosensitive material, since it is possible to polymerize and cure these photosensitive resin compositions by light irradiation.

Among these, transparent photosensitive resin compositions are used for column spacers, overcoats and passivation films, typically do not use coloring compounding such as pigments, and include an alkali-soluble resin, a polymerizable compound having an ethylenic unsaturated bond, a photopolymerization initiator, and a solvent.

Among these, coloring photosensitive resin compositions are used for color filter photoresists and photoresists for a resin black matrix, and typically include a red, green, blue or black coloring agent, an alkali-soluble resin, a polymerizable compound having an ethylenic unsaturated bond, a photopolymerization initiator, and a solvent.

With the application of an LCD being high-quality and diversified, photosensitive resin compositions are manufactured to be used in composing the liquid crystal display devices of televisions and monitors, in addition to conventional uses such as for notebook computers and mobile devices, and demand for compositions that react to light quickly and have excellent mechanical properties has increased in order to improve productivity and resistance. The characteristic of reacting to light quickly, that is, photosensitivity, is becoming a factor that plays a very important role when a pattern is formed using a photolithography method, or when an insulator protective film is formed through whole exposure. In addition, a column spacer, which plays the role of a support, or an overcoat and a passivation film, which play the role of a protective film, must have excellent mechanical properties, so that a liquid crystal display device is not damaged by shocks applied from the outside, but retains its original performance.

Consequently, these problems can be solved using a photopolymerization initiator having excellent photosensitivity. When a photopolymerization initiator having excellent photosensitivity is used, sufficient sensitivity can be achieved even with small amounts of the photopolymerization initiator, and thus there are advantages in that the breadth of availability of other raw materials increases when a composition is prepared, the causes of pollution attributable to a liquid crystal are reduced, and the retention rate of a pattern increases.

Therefore, there is the demand for the development of a photopolymerization initiator that efficiently absorbs UV light source even when it is used in small quantities, and has excellent sensitivity and high-temperature process properties.

PRIOR ART DOCUMENT

Patent Document

Japanese Patent Application Laid-Open Publication NO. S61-118423

SUMMARY OF THE INVENTION

In view of the above, the objective of the present application is to provide a novel photoactive compound that overcomes all the shortcomings of conventional photopolymerization initiators, is easily stored without lowering sensitivity, chemical resistance or developability, and has excellent fume properties in a high-temperature process, and a photosensitive resin composition comprising the same.

One embodiment of the present application provides a photoactive compound represented by Formula 1.

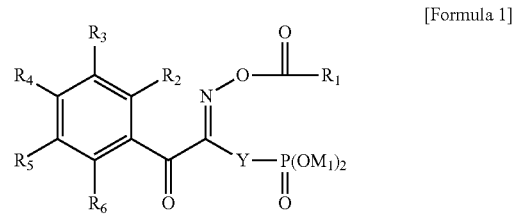

[Formula 1]

In Formula 1,

Y is a $C_1$-$C_{15}$ alkylene group unsubstituted or substituted with one or more substituents selected from the group consisting of R, OR, SR, COR and OCOR, $M_1$ is a $C_1$-$C_8$ alkyl group or a $C_6$-$C_{12}$ aryl group, $R_1$ is a $C_1$-$C_8$ alkyl group or a $C_6$-$C_{12}$ aryl group, at least one of $R_2$ to $R_6$ is XA, and the rest are each independently selected from the group consisting of a halogen group, CN, R, OR, SR, COR, OCOR, NRR' and CONRR', X is directly linked or selected from the group consisting of C=O, O, S, S=O, and $SO_2$ A is a $C_6$-$C_{20}$ aryl group unsubstituted or substituted with one or more substituents selected from the group consisting of a halogen group, CN, R, OR, SR, COR, OCOR, NRR' and CONRR', R and R' are each independently selected from the group consisting of hydrogen, a $C_1$-$C_{10}$ alkyl group, a $C_1$-$C_{10}$ haloalkyl group and a $C_7$-$C_{13}$ arylalkyl group, or R and R' may form a ring together.

Another embodiment of the present application provides a photosensitive resin composition including the photoactive compound represented by Formula 1, an alkali-soluble binder resin, a polymerizable compound including an ethylenic unsaturated bond, and a solvent.

Still another embodiment of the present application provides a photosensitive material prepared using the photosensitive resin composition.

Still another embodiment of the present application provides an electronic device manufactured using the photosensitive resin composition.

Advantageous Effects

The compound provided through the present application is easily stored without lowering sensitivity, chemical resistance or developability, and has excellent properties in preventing the generation of fumes in a high-temperature process. As a result, the photosensitive resin composition according to the present application has advantages in manufacturing electronic devices, and has advantages in curing column spacers, overcoats and passivation materials of liquid crystal display devices.

DETAILED DESCRIPTION OF THE EMBODIMENTS

The advantages and features of the present application, and the methods to achieve these advantages and features will become clear when referencing the embodiments delivered below in detail. However, the present application is not limited to the embodiments described below, and will be realized in various different forms, and the present embodiments make the delivery of the present application complete, and are provided in order to completely make known the range of the invention to those skilled in the art relating to the present application, and the present application is only defined by the range of the claims.

Unless otherwise specified, all the terms (including technical and scientific terms) used herein may be used according to the meanings commonly understandable to those skilled in the art relating to the present application. In addition, the terms defined in generally used dictionaries are not interpreted either ideally or excessively unless clearly specially defined otherwise.

Hereinafter, the present application will be described in detail.

The inventors of the present application have synthesized a compound having a structure that includes an oxime ester group and a phosphonate group together within one molecule, and have demonstrated that such a compound efficiently absorbs ultraviolet light and has excellent sensitivity and high-temperature process properties compared with other existing photoinitiators.

Existing photoactive compounds including an oxime ester group have had the following problems.

As the photoinitiators having an oxime ester structure, photoinitiators using α-oxooxime derivatives (Japanese Patent Application Laid-Open Publication No. S61-118423), β-aminooxime (U.S. Pat. No. 5,776,996), and the like, have been developed.

However, among the oxime derivative compounds used as above, the compounds developed early on have low photoinitiation efficiency, and are not efficient in UV light source absorption when the color characteristics are good. The compounds developed since the late 1990s have significantly improved photoinitiation efficiency, but do not sufficiently satisfy the demand for shortened processing time, which has recently intensified. Particularly, they do not satisfy the degree of curing of a thick film having a high pigmentation concentration or a coating film thickness of 2.5 μm or more, and as a result, there are still difficulties in forming a fine pattern, and the formed pattern cannot satisfy the critical dimension (CD) or the mechanical strengths required for products.

Oxime derivative compounds known in the art have disadvantages in that they have low photoinitiation efficiency, are inferior in terms of processing time, have weak mechanical strengths, or have poor storage stability.

Irgacure OXE 01 and Irgacure OXE 02, which are oxime ester-based photopolymerization initiators manufactured by BASF Corporation and have been recently commercialized, have significantly improved sensitivity, and have been drawing attention for their application as photosensitive resin compositions. However, these photopolymerization initiators are rather high-priced, and cannot be used economically in sufficient quantities to give sufficient sensitivity, and the storage stability of the photopolymerization initiator itself is poor.

The photoactive compound according to one embodiment of the present application has advantages in that it has excellent photoinitiation efficiency, shortens processing time, has excellent mechanical strength, has excellent economic advantages, has improved storage stability, and has excellent developability compared with conventional oxime ester-based photopolymerization initiators. In addition, the photoactive compound according to one embodiment of the present application has advantages in that it has excellent sensitivity and is stable over time due to its sufficient solubility for a polymerizable compound having an ethylenic unsaturated bond. Furthermore, the photoactive compound according to one embodiment of the present application has advantages in that it has excellent efficiency in generating radicals by efficiently absorbing ultraviolet light of i-line (365 nm), has excellent solubility and compatibility with a binder, and has excellent high-temperature process characteristics.

One embodiment of the present application provides a photoactive compound represented by Formula 1.

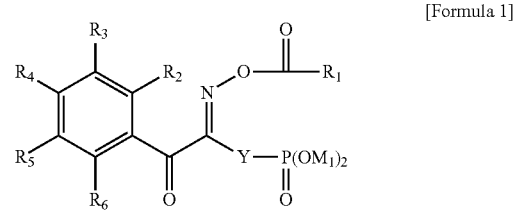

[Formula 1]

In the compound according to one embodiment of the present application, Formula 1 may be Formula 2.

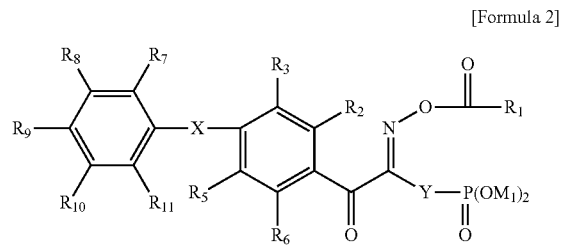

[Formula 2]

In the compound according to one embodiment of the present application, the substituents of Formula 1 and Formula 2 are more specifically described as follows.

Y may be a $C_1$-$C_{15}$ alkylene group, or a $C_1$-$C_{15}$ alkylene group substituted with one or more substituents selected from the group consisting of R, OR, SR, COR and OCOR, and preferably a $C_2$-$C_6$ alkylene group. Y is more preferably an ethylene group or a propylene group in terms of solubility and compatibility.

$M_1$ may be a $C_1$-$C_8$ alkyl group or a $C_6$-$C_{12}$ aryl group, preferably a $C_1$-$C_{10}$ alkyl group, and more preferably a methyl group or an ethyl group.

$R_1$ may be a $C_1$-$C_8$ alkyl group or a $C_6$-$C_{12}$ aryl group, and preferably a methyl group or a phenyl group. $R_1$ is a portion decomposed to radicals, which are active species, when exposed, and does not have limitations as to its structure, however, photoinitiation efficiency is improved when the structure is simpler due to better movement.

At least one of $R_2$ to $R_6$ may be XA, and preferably, $R_4$ may be XA. The rest of $R_2$ to $R_6$ that are not XA may be each independently selected from the group consisting of a halogen group, CN, R, OR, SR, COR, OCOR, NRR' and CONRR'.

X may be directly linked, or may be selected from the group consisting of C=O, O, S, S=O, and $SO_2$, and preferably O or S.

In Formula 1, A is a $C_6$-$C_{20}$ aryl group unsubstituted or substituted with one or more substituents selected from the group consisting of a halogen group, CN, R, OR, SR, COR, OCOR, NRR' and CONRR', and preferably a phenyl group unsubstituted or substituted with one or more substituents selected from the group consisting of a halogen group, CN, R, OR, SR, COR, OCOR, NRR' and CONRR'.

The substituents corresponding to A in Formula 2 are $R_7$, $R_8$, $R_9$, $R_{10}$ or $R_{11}$. $R_7$, $R_8$, $R_9$, $R_{10}$ and $R_{11}$ may be each independently selected from the group consisting of a halogen group, CN, R, OR, SR, COR, OCOR, NRR' and CONRR'.

R and R' may be each independently selected from the group consisting of hydrogen, a $C_1$-$C_{10}$ alkyl group, a $C_1$-$C_{10}$ haloalkyl group and a $C_7$-$C_{13}$ arylalkyl group, or R and R' may form a ring together. When R and R' form a ring together, a five-membered, six-membered or seven-membered ring may be formed, and the ring may be either monocyclic or polycyclic, and may be an aromatic ring, an aliphatic ring, a heteroaromatic ring or a heteroaliphatic ring.

The halogen group may be fluorine, chlorine, bromine or iodine.

The aryl group may be a monocyclic aryl group or a polycyclic aryl group.

When the aryl group is a monocyclic aryl group, the monocyclic aryl group may specifically include a phenyl group, a biphenyl group, a terphenyl group, a stilbenzyl group and the like, but is not limited thereto.

When the aryl group is a polycyclic aryl group, the polycyclic aryl group may specifically include a naphthyl group, an anthryl group, a phenanthryl group, a pyrenyl group, a perylenyl group, a chrysenyl group, a fluorenyl group and the like, but is not limited thereto.

The alkyl group may be a straight chain, a branched chain or a ring chain. Specific examples of the alkyl group may include a methyl group, an ethyl group, an n-propyl group, an iso-propyl group, an n-butyl group, a sec-butyl group, a t-butyl group, an n-pentyl group, an iso-pentyl group, a neopentyl group, an n-hexyl group, a cyclopropyl group, a cyclobutyl group, a cyclopentyl group, a cyclohexyl group and the like, but are not limited thereto.

The alkoxy group may be a straight chain, a branched chain or a ring chain, and either substituted or unsubstituted. Examples of the alkoxy group may include a methoxy group, an ethoxy group, an n-propyloxy group, an iso-propyloxy group, an n-butyloxy group, a cyclopentyloxy group and the like, but are not limited thereto.

The alkylene group may be a straight chain or a branched chain, and may be either substituted or unsubstituted. Specific examples of the alkylene group may include a methylene group, an ethylene group, a propylene group, an isopropylene group, a butylene group, a t-butylene group and the like, but are not limited thereto.

The term "substituted or unsubstituted" used herein means being substituted with one or more substituents, or having no substituents.

In Formula 1 or Formula 2, the portion in which substituents are not specifically defined may be hydrogen.

The photoactive compound of the present application represented by Formula 1 or Formula 2 includes an oxime ester group and a phosphonate group (—Y—PO(OM$_1$)$_2$) within the structure, and includes a substituted or unsubstituted phenyl group.

The phosphonate group increases the solubility of the compound represented by Formula 1 or Formula 2, and improves the solubility and lowers the volatility of a photosensitive resin composition by forming a hydrogen bond or the like with an alkali-soluble binder resin in the photosensitive resin composition, thereby having high compatibility with the binder resin.

Due to its high melting point, the photoactive compound of the present application represented by Chemical 1 or Formula 2 has advantages in that it is easy to store, and in that it is effective in preventing the generation of fumes in a high-temperature process. Using the preparation of a color filter as an example, when photosensitive resin compositions including conventional photoactive compounds are used, defects may occur since fumes are generated in an exposure process, and the fumes volatilize in the air and then adheres to parts such as a mask. Defects may also occur since fumes are generated in a baking process, and the fumes adhere to an oven wall and then become a foreign substance when becoming detached. However, when the photosensitive resin composition including the photoactive compound of the present application is used, there are advantages in that the occurrence of defects may be suppressed in an exposure process or a baking process since the generation of fumes is effectively prevented in a high-temperature process.

In the compound according to one embodiment of the present application, specific examples of the compound represented by Formula 1 or Formula 2 are as follows, however, the examples are not limited thereto.

[Formula 3]

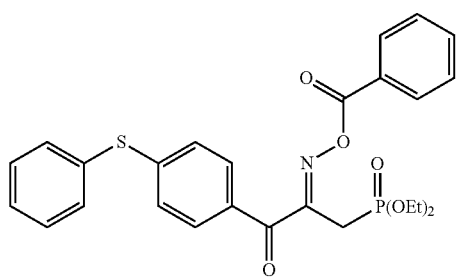

[Formula 4]

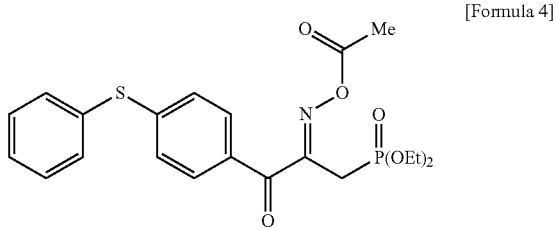

[Formula 5]

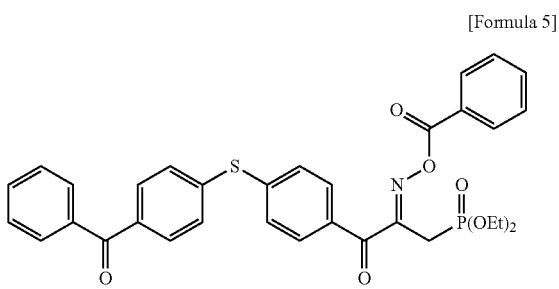

[Formula 6]

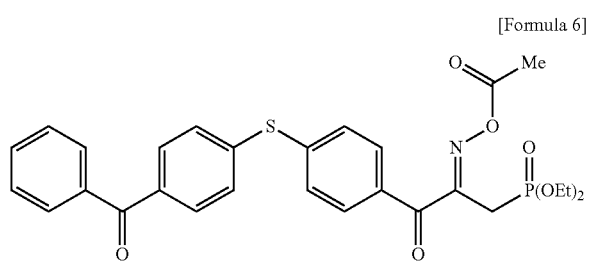

One embodiment of the present application provides a photosensitive resin composition including the photoactive compound represented by Formula 1, an alkali-soluble binder resin, a polymerizable compound including an ethylenic unsaturated bond, and a solvent.

In one embodiment of the present application, the compound of Formula 1 may be the compound of Formula 2. In addition, in one embodiment of the present application, the compound of Formula 1 or Formula 2 may be any one of the compounds of Formula 3 to Formula 6.

In the photosensitive resin composition according to one embodiment of the present application, the amount of the added photoactive compound represented by Formula 1 may range from 0.1 to 5% by weight of the total weight of the photosensitive resin composition, but is not limited thereto. When the amount is less than 0.1% by weight, sufficient sensitivity may not be exhibited, and when greater than 5% by weight, UV light may not be delivered to the bottom due to high UV absorption.

The photosensitive resin composition according to one embodiment of the present application, by including a binder resin, is effective in controlling viscosity and in making the patterning using an alkali developing solution possible. As the binder, generally used binders in the art, such as an alkali-soluble polymer resin, may be used. Specifically, the alkali-soluble binder resin may include a monomer including an acid functional group, a copolymer of a monomer giving film strength and capable of copolymerizing with this monomer, or a compound prepared through a polymer reaction of this copolymer with an ethylenic unsaturated compound containing an epoxy group.

The alkali-soluble binder resin used in the present application may have an acid value ranging from approximately 30 to 300 KOH mg/g. When the acid value is less than 30 KOH mg/g, a clean pattern cannot be obtained due to poor development, and if greater than 300 KOH mg/g, a pattern can come away due to excessively increased washability.

The weight average molecular weight of the alkali-soluble binder resin preferably has a range from 1,000 to 200,000, and more preferably has a range from 5,000 to 100,000. When the weight average molecular weight of the alkali-soluble binder resin is less than 1,000, heat resistance and chemical resistance worsen, and if greater than 200,000, the resin is not well developed since the solubility in a developing solution decreases, and uniform application is difficult since the viscosity of the solution excessively increases, therefore, it is not preferable.

Non-limiting examples of the monomer including an acid group include (meth)acrylic acid, crotonic acid, itaconic acid, maleic acid, fumaric acid, monomethyl maleic acid, isoprene sulfonic acid, styrene sulfonic acid, 5-norbornene-2-carboxylic acid, mono-2-((meth)acryloyloxy)ethyl phthalate, mono-2-((meth)acryloyloxy)ethyl succinate, ω-carboxyl polycarprolactone mono(meth)acrylate, a mixture thereof, or the like.

Non-limiting examples of the monomer capable of copolymerizing with the monomer including an acid group include unsaturated carboxylate esters such as benzyl (meth)acrylate, methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, isobornyl (meth)acrylate, ethylhexyl (meth)acrylate, 2-phenoxyethyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, acyloctyloxy-2-hydroxypropyl (meth)acrylate, glycerol (meth)acrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol)methylether (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, methyl α-hydroxymethyl acrylate, ethyl α-hydroxymethyl acrylate, propyl α-hydroxymethyl acrylate, butyl α-hydroxymethyl acrylate, dicyclopentanyl (meth)acrylate, dicyclopentenyl (meth)acrylate, dicyclopentanyl oxyethyl (meth)acrylate and dicyclopentenyl oxyethyl (meth)acrylate;

aromatic vinyls such as styrene, α-methylstyrene, (o,m,p)-vinyl toluene, (o,m,p)-methoxystyrene and (o,m,p)-chlorostyrene;

unsaturated ethers such as vinyl methyl ether, vinyl ethyl ether and allyl glycidyl ether;

N-vinyl tertiary amines such as N-vinylpyrrolidone, N-vinylcarbazole and N-vinylmorpholine; unsaturated imides such as N-phenylmaleimide, N-(4-chlorophenyl)maleimide, N-(4-hydroxyphenyl)maleimide and N-cyclohexyl maleimide; maleic anhydrides such as maleic anhydride and methylmaleic anhydride;

unsaturated glycidyl compounds such as allyl glycidyl ether, glycidyl (meth)acrylate and 3,4-epoxycyclohexylmethyl (meth)acrylate, a mixture thereof, or the like.

The ethylenic unsaturated compound containing an epoxy group may include one or more species selected from the group consisting of allyl glycidyl ether, glycidyl (meth)acrylate, 3,4-epoxycyclohexylmethyl (meth)acrylate, glycidyl 5-norbonene-2-methyl-2-carboxylate (an endo and exo mixture), 1,2-epoxy-5-hexene and 1,2-epoxy-9-decene.

In the photosensitive resin composition according to one embodiment of the present application, the content of the binder resin may range from 1 to 30% by weight based on the total weight of the photosensitive resin composition, but is not limited thereto. If the content of the binder resin is 1% by weight or more, it is effective in facilitating patterning using an alkali aqueous solution and in preventing the problem of pattern formation becoming difficult due to the lack of solubility in a developing solution. If the content of the binder resin is 30% by weight or less, it is effective in preventing the occurrence of pattern loss in a developing process, and in preventing the problem of difficulty in coating due to the viscosity of the total solution becoming too high.

The photosensitive resin composition according to one embodiment of the present application may include a cross-linking compound, and specifically, a polymerizable compound including an ethylenic unsaturated bond may be used. More specifically, a cross-linking compound including two or more unsaturated acrylic groups and a cross-linking compound including three or more unsaturated acrylic groups may be used. Specific examples include one or more species selected from the group consisting of a compound obtained by the esterification of polyhydric alcohols such as ethylene glycol di(meth)acrylate, polyethylene glycol di(meth)acrylate having 2 to 14 ethylenic groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethyl phthalic acid, propylene glycol di(meth)acrylate having 2 to 14 propylene groups, dipentaerythritol penta(meth)acrylate, dipentaerythritol hexa(meth)acrylate and a mixture of an acid denatured compound of dipentaerythritol penta(meth)acrylate and dipentaerythritol hexa(meth)acrylate (trade name TO-2348, TO-2349, manufactured by Toagosei Co., Ltd.), using $\alpha,\beta$-unsaturated carboxylic acid; a compound obtained by adding (meth) acrylic acid to the compound containing a glycidyl group such as a trimethylolpropane triglycidyl ether acrylic acid adduct and a bisphenol A diglycidyl ether acrylic acid adduct; an ester compound of polycarboxylic acid with a compound having a hydroxyl group or an ethylenic unsaturated bond such as phthalic acid diester of $\beta$-hydroxyethyl (meth)acrylate and a toluene diisocyanate adduct of 3-hydroxyethyl (meth)acrylate, or an adduct polyisocyanate with the compound having a hydroxyl group or an ethylenic unsaturated bond; (meth)acrylic acid alkyl esters such as methyl (meth) acrylate, ethyl (meth)acrylate, butyl (meth)acrylate and 2-ethylhexyl (meth)acrylate; and 9,9'-bis[4-(2-acryloyloxyethoxy)phenyl]fluorene, but are not limited thereto, and compounds known in the art may be used. In addition, according to the circumstances, silica dispersions may be put into these compounds, and examples thereof include Nanocryl XP series (0596, 1045, 21/1364) and Nanopox XP series (0516, 0525) manufactured by Hanse Chemie GmbH, and the like.

In the photosensitive resin composition according to one embodiment of the present application, the content of the cross-linking compound, specifically, the polymerizable compound including an ethylenic unsaturated group, may range from 0.5 to 30% by weight based on the total weight of the photosensitive resin composition, but is not limited thereto. If the content is less than 0.5% by weight, it is not preferable since a cross-linking reaction by light does not proceed, and if greater than 30% by weight, there is a disadvantage in that pattern formation is difficult due to poor solubility for alkali.

In the photosensitive resin composition according to one embodiment of the present application, non-limiting examples of the solvent include one or more species selected from the group consisting of methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, and dipropylene glycol monomethyl ether.

In the photosensitive resin composition according to one embodiment of the present application, the content of the solvent may range from 40 to 95% by weight based on the total weight of the photosensitive resin composition, but is not limited thereto.

The photosensitive resin composition according to one embodiment of the present application is a transparent photosensitive resin composition, and may include the photoactive compound represented by Formula 1 in an amount of 0.1 to 5% by weight, the polymerizable compound including an ethylenic unsaturated bond in an amount of 0.5 to 30% by weight, the alkali-soluble binder resin in an amount of 1 to 30% by weight, and the solvent in an amount of 40 to 95% by weight.

The photosensitive resin composition according to one embodiment of the present application may further include a coloring agent.

In the photosensitive resin composition according to one embodiment of the present application, one or more species of pigments, dyes, or mixtures thereof may be used as the coloring agent. As specific examples thereof, carbon black, graphite, metal oxides such as titan black, and the like may be used as black pigments. Examples of the carbon black include Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS and Cisto SSRF (Tokai Carbon Co., Ltd.); Diagram Black II, Diagram Black N339, Diagram Black SH, Diagram Black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Co., Ltd); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, RAVEN-1170 (Columbia Carbon Co., Ltd.), a mixture thereof, or the like. In addition, examples of the color visible coloring agent include Carmine 6B (C.I. 12490), Phthalocyanine Green (C.I. 74260), Phthalocyanine Blue (C.I. 74160), Perylene Black (BASF K0084. K0086), Cyanine Black, Linoleic Yellow (C.I. 21090), Linoleic Yellow GRO (C.I. 21090), Benzidine Yellow 4T-564D, Victoria Pure Blue (C.I. 42595), C.I. PIGMENT Red 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264 and 272; C.I. PIGMENT Green 7, 36 and 58; C.I. PIGMENT Blue 15:1, 15:3, 15:4, 15:6, 16, 22, 28, 36, 60 and 64; C.I. PIGMENT Yellow 13, 14, 35, 53, 83, 93, 95, 110, 120, 138, 139, 150, 151, 154, 175, 180, 181, 185, 194 and 213; C.I. PIGMENT Violet 15, 19, 23, 29, 32, 37, and the like, and white pigments, fluorescent pigments, and the like may also be used besides these. As the phthalocyanine-based complexes used as pigments, materials with zinc as the main metal, besides copper, may also be used.

In the photosensitive resin composition according to one embodiment of the present application, the content of the coloring agent may range from 1 to 20% by weight based on the total weight of the photosensitive resin composition, but is not limited thereto.

The photosensitive resin composition according to one embodiment of the present application is a colored photosensitive resin composition, and may include the photoactive compound represented by Formula 1 in an amount of 0.1 to 5% by weight, the polymerizable compound including an ethylenic unsaturated bond in an amount of 0.5 to 30% by weight, the alkali-soluble binder resin in an amount of 1 to 30% by weight, the coloring agent in an amount of 1 to 20% by weight, and the solvent in an amount of 40 to 95% by weight.

The photosensitive resin composition according to one embodiment of the present application may additionally include one, two or more additives such as a second photoactive compound, a curing accelerator, a thermal polymerization inhibitor, a dispersant, an antioxidant, a UV absorber, a plasticizer, an adhesion accelerator, a filler or a surfactant as necessary, in addition to the above constituents.

When the additives are added in one embodiment of the present application, it is preferable that the second photoactive compound be included in an amount of 0.1 to 5% by weight, and that the rest of the additives be each included in amounts ranging from 0.01 to 5% by weight.

In the photosensitive resin composition according to one embodiment of the present application, the second photoactive compound may be selected from the group consisting of, specifically, a triazine-based compound, a biimidazole-based compound, an acetophenone-based compound, an O-acyloxime-based compound, a benzophenone-based compound, a thioxanthone-based compound, a phosphine oxide-based compound, and a coumarine-based compound. More specifically, the second photoactive compound includes a triazine-based compound such as 2,4-trichloromethyl-(4'-methoxyphenyl)-6-triazine, 2,4-trichloromethyl-(4'-methoxystyryl)-6-triazine, 2,4-trichloromethyl-(fipronil)-6-triazine, 2,4-trichloromethyl-(3',4'-dimethoxyphenyl)-6-triazine, 3-{4-[2,4-bis(trichloromethyl)-s-triazin-6-yl] phenylthio}propanoic acid, 2,4-trichloromethyl-(4'-ethylbiphenyl)-6-triazine, and 2,4-trichloromethyl-(4'-methylbiphenyl)-6-triazine, a biimidazole compound such as 2,2'-bis(2-chlorophenyl)-4,4',5,5'-tetraphenylbiimidazole, and 2,2'-bis(2,3-dichlorophenyl)-4,4',5,5'-tetraphenylbiimidazole;

an acetophenone-based compound such as 2-hydroxy-2-methyl-1-phenylpropan-1-one, 1-(4-isopropylphenyl)-2-hydroxy-2-methylpropan-1-one, 4-(2-hydroxyethoxy)-phenyl (2-hydroxy)propyl ketone, 1-hydroxycyclohexyl phenyl ketone, 2,2'-dimethoxy-2-phenyl acetophenone, 2-methyl-(4-methylthiophenyl)-2-morpholino-1-propan-1-one (Irgacure-907), and 2-benzyl-2-dimethylamino-1-(4-morpholinophenyl)-butan-1-one (Irgacure-369), an O-acyloxime-based compound such as Irgacure OXE 01 and Irgacure OXE 02, manufactured by BASF Corporation, and N-1919, NCI-831 and NCI-930, manufactured by ADEKA Corporation, a benzophenone-based compound such as 4,4'-bis(dimethylamino)benzophenone and 4,4'-bis(diethylamino)benzophenone, a thioxantone-based compound such as 2,4-diethylthioxantone, 2-chlorothioxantone, isopropylthioxantone and diisopropylthioxantone, a phosphine oxide-based compound such as 2,4,6-trimethylbenzoyl diphenylphosphine oxide, bis(2,6-dimethoxybenzoyl)-2,4,4'-trimethylpentyl phosphine oxide and bis(2,6-dichlorobenzoyl)propyl phosphine oxide, and a coumarine-based compound such as 3,3'-carbonylvinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine and 10,10'-carbonylbis[1,1',7,7'-tetramethyl-2,3,6,7-tetrahydro-1H,5H,11H—Cl]-benzopyrano[6,7,8-ij]-quinolizin-11-one, and the like.

In the photosensitive resin composition according to one embodiment of the present application, examples of the curing accelerator includes one or more species selected from the group consisting of 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyrydine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate) and trimethylolethane tris(3-mercaptopropionate), but are not limited thereto, and may include those known in the art.

In the photosensitive resin composition according to one embodiment of the present application, the thermal polymerization inhibitor may include one or more species selected from the group consisting of p-anisole, hydroquinone, pyrocatechol, t-butylcatechol, an N-nitrosophenylhydroxyamine ammonium salt, an N-nitrosophenylhydroxyamine aluminum salt and phenothiazine, but are not limited thereto, and may include those known in the art.

In the photosensitive resin composition according to one embodiment of the present application, a polymer-type, nonionic, anionic or cationic dispersant may be used as the dispersant. Non-limiting examples of the dispersant include polyalkyleneglycol and esters thereof, polyoxyalkylene polyhydric alcohols, esteralkylene oxide adducts, alcoholalkylene oxide adducts, sulfonic acid esters, sulfonic acid salts, carboxylic acid esters, carboxylic acid salts, alkylamide alkylene oxide adducts, alkylamine and the like, and one type or a mixture of two or more species selected from among these may be used, but are not limited thereto.

In the photosensitive resin composition according to one embodiment of the present application, non-limiting examples of the antioxidant include one or more species selected from 2,2'-thiobis(4-methyl-6-t-butylphenol) and 2,6-g,t-butylphenol, but are not limited thereto.

In the photosensitive resin composition according to one embodiment of the present application, non-limiting examples of the UV absorbent include one or more species selected from 2-(3-t-butyl-5-methyl-2-hydroxyphenyl)-5-chlorobenzotriazol and alkoxy benzophenone, but are not limited thereto.

In the photosensitive resin composition according to one embodiment of the present application, the surfactant may include MCF 350SF, F-475, F-488, F 552 (hereinafter DIC Corporation), but are not limited thereto.

Additionally, all compounds that can be included in conventional photosensitive resin compositions may also be used as the plasticizer, the adhesion accelerator, the filler or the like.

One embodiment of the present application provides a photosensitive material including the photosensitive resin composition.

One embodiment of the present application provides a photosensitive material prepared using the photosensitive resin composition.

The photosensitive resin composition is present in a state in which at least a portion of the solvent is removed or photocured by drying and/or curing in the photosensitive material.

Meanwhile, the photosensitive resin composition according to the present application may be used in a roll coater, a curtain coater, a spin coater, a slot die coater, various printings, precipitations and the like, and may be applied on a support such as a metal, paper, glass or plastic substrate.

Furthermore, after being applied on a support such as a film, the composition may be transferred on other supports, or it is possible that the composition is transferred on a blanket or the like after being applied on a first support, and then transferred once more on a second support, and the application method thereof is not particularly limited.

Examples of a light source for curing the photosensitive resin composition of the present application include a mercury vapor arc, a carbon arc, a Xe arc and the like, which emit light with a wavelength of 250 to 450 nm.

The photosensitive resin composition including the compound of the present application is preferably used in pigment dispersion-type photosensitive material for manufacturing a TFT LCD color filter, photosensitive material for forming a black matrix of a TFT LCD or an organic light emitting diode, photosensitive material for forming an overcoat layer, column spacer photosensitive material, photosensitive material for printed circuit boards, and other transparent photosensitive material, but may also be used for the manufacture of photocurable paints, photocurable inks, photocurable adhesives, printing plates, and PDPs, and the purpose thereof is not particularly limited.

One embodiment of the present application provides an electronic device manufactured using the photosensitive resin composition.

Those skilled in the art relating to the present application will be able to perform various applications and modifications within the scope of the present application based on the above contents.

Hereinbefore, specific parts of the present application have been described, and it is clear that, for those skilled in the art, these specific descriptions are only preferable embodiments, and do not limit the scope of the present application. Therefore, the actual scope of the present application is defined by the attached claims and equivalents thereof.

Hereinafter, the present invention will be described in detail with reference to examples. However, it is to be understood that the following examples are for illustrative purposes only, and the scope of the present invention includes the scope described in the following claims, and substitutions and modifications thereof, and is not limited to the scope of the examples.

EXAMPLES

Synthesis Example 1

Preparation of Compound of Formula 3

(1) Preparation of 9-(6-bromohexyl)-carbazole, 1a

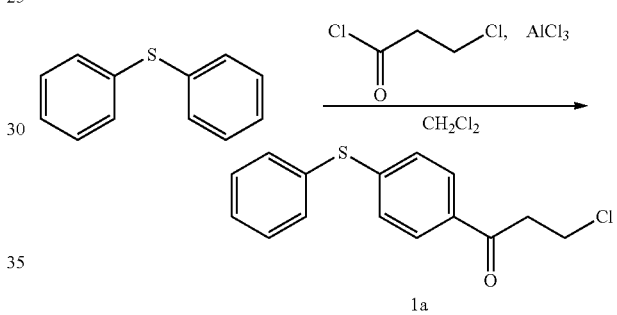

After 55.9 g (300 mmol) of diphenyl sulfide was dissolved in 500 mL of dichloromethane, 42 g (315 mmol) of aluminum chloride and 40 g (315 mmol) of 3-chloropropionyl chloride were slowly added thereto at a temperature ranging from 0 to 10° C. After stirring the mixture for a further 30 minutes at this temperature, the temperature was raised to room temperature and the mixture was stirred for an additional 2 hours. After the result was poured into a beaker containing ice water, the organic layer was extracted and washed with a saturated aqueous solution of NaHCO$_3$, and the water in the organic layer was removed using anhydrous sodium sulfate. The solvent was removed under vacuum, and recrystallization was performed in ethyl acetate/hexane (1/5), resulting in 64.5 g of the acyl compound (1a) (yield: 78%). The measurement result of 1a using $^1$H-NMR is as follows.

1H NMR (500 MHz, CDCl$_3$, ppm): 7.85-7.80 (2H, d, ArH), 7.55-7.48 (2H, m, ArH), 7.45-7.37 (3H, m, ArH), 7.23-7.18 (2H, d, ArH), 3.91 (2H, t, CH2), 3.39 (2H, t, CH$_2$)

(2) Preparation of 1b

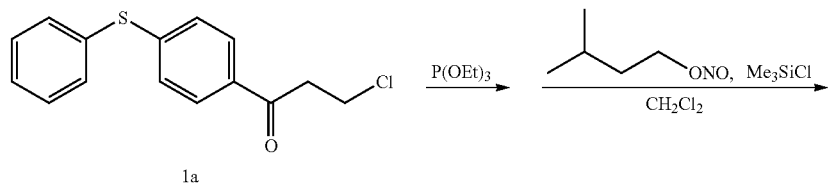

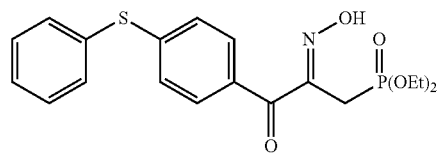

1b

After 64.3 g (232 mmol) of the compound (1a) obtained in (1) and 0.23 g (7 mmol) of tetrabutylammonium bromide were dissolved in 231 g of triethyl phosphite, the mixture was stirred for 1 hour under a nitrogen atmosphere at 150° C. The mixture was cooled to room temperature, and the residual solvent was removed under vacuum. After the residue was dissolved in 600 mL of dichloromethane, 35 g of isoamyl nitrite and 32.8 g of trimethylchlorosilane were slowly added thereto at a temperature ranging from 0 to 10° C. After stirring the mixture for a further 30 minutes at this temperature, the temperature was raised to room temperature and the mixture was stirred for an additional 2 hours. After the result was washed with a saturated aqueous solution of $NaHCO_3$, the water in the organic layer was removed using anhydrous magnesium sulfate, the solvent was removed under vacuum, and recrystallization was performed in ethyl acetate/hexane (1/3), resulting in 68.9 g of the oxime compound (1b) (yield: 73%). The measurement result of 1b using $^1$H-NMR is as follows.

1H NMR (500 MHz, $CDCl_3$, ppm): 11.4 (1H, s, NOH), 7.85-7.80 (2H, d, ArH), 7.88-7.80 (2H, m, ArH), 7.50-7.44 (2H, m, ArH), 7.40-7.35 (3H, m, ArH), 7.13-7.08 (2H, d, ArH), 4.16-4.00 (4H, m, $2OCH_2$), 3.47 (2H, d, $CH_2$), 1.26-1.15 (6H, m, $2CH_3$).

(3) Preparation of Compound of Formula 3

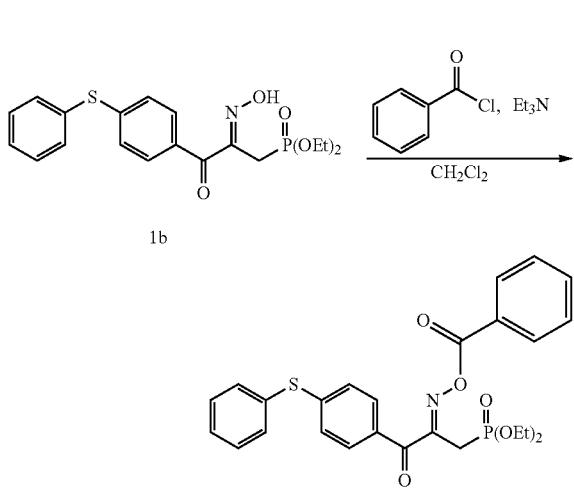

Formula 3

Benzoyl chloride (28 g, 200 mmol) was added to a solution of 67.8 g (167 mmol) of the compound (1b) obtained in (2) and triethylamine (22 g, 217 mmol) being dissolved in 500 mL of dichloromethane, and the mixture was stirred for 1 hour at room temperature. After the result was washed twice with a saturated aqueous solution of $NaHCO_3$, the water in the organic layer was removed using anhydrous magnesium sulfate, the solvent was removed under vacuum, and recrystallization was performed in ethyl acetate/hexane (1/3), resulting in 77.7 g of the compound of Formula 3 (yield: 91%). The measurement result of the compound of Formula 3 using $^1$H-NMR is as follows.

1H NMR (500 MHz, $CDCl_3$, ppm): 8.20-8.11 (2H, d, ArH), 8.09-8.03 (2H, d, ArH), 7.69-7.62 (1H, m, ArH), 7.55-7.44 (4H, m, ArH), 7.44-7.39 (3H, m, ArH), 7.25-7.19 (2H, d, ArH), 4.10-4.00 (4H, m, $2OCH_2$), 3.70 (2H, d, CH2), 1.18-1.11 (6H, m, $2CH_3$).

Synthesis Example 2

Preparation of Compound of Formula 4

The photoactive compound represented by Formula 4 was obtained by performing the reaction in the same manner as in Synthesis Example 1 except that acetyl chloride was used instead of benzoyl chloride in Step (3) of Synthesis Example 1. The measurement result of the photoactive compound represented by Formula 4 using $^1$H-NMR is as follows.

[Formula 4]

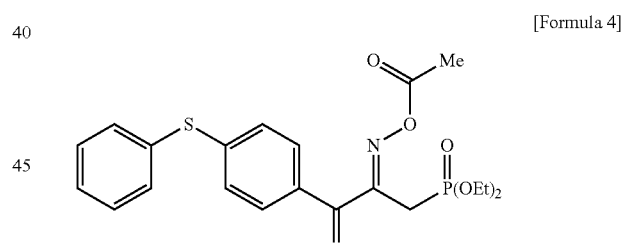

1H NMR (500 MHz, $CDCl_3$, ppm): 8.00-7.92 (2H, d, ArH), 7.56-7.50 (2H, m, ArH), 7.45-7.40 (3H, m, ArH), 7.20-7.15 (2H, d, ArH), 4.10-4.00 (4H, m, $2OCH_2$), 3.57 (2H, d, $CH_2$), 2.26 (3H, s, $OCH_3$), 1.18-1.09 (6H, m, $2CH_3$).

Synthesis Example 3

Preparation of Compound of Formula 5

The photoactive compound represented by Formula 5 was obtained by performing the reaction in the same manner as in Synthesis Example 1 except that 4-benzoyldiphenyl sulfide was used instead of diphenyl sulfide in Step (1) of Synthesis Example 1. The measurement result of the photoactive compound represented by Formula 5 using $^1$H-NMR is as follows.

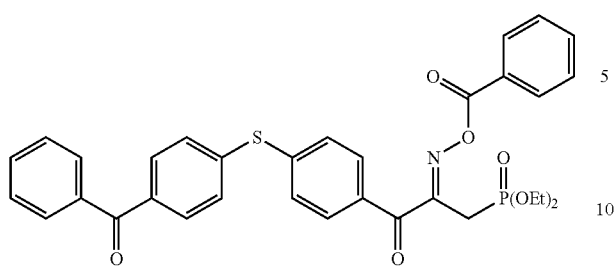

[Formula 5]

1H NMR (500 MHz, CDCl₃, ppm): 8.20-8.12 (4H, m, ArH), 7.84-7.77 (4H, m, ArH), 7.68-7.58 (2H, m, ArH), 7.56-7.40 (8H, m, ArH), 4.10-4.00 (4H, m, 2OCH₂), 3.72 (2H, d, CH₂), 1.15-1.06 (6H, m, 2CH₃).

Synthesis Example 4

Preparation of Compound of Formula 6

The photoactive compound represented by Formula 6 was obtained by performing the reaction in the same manner as in Synthesis Example 2 except that 4-benzoyldiphenyl sulfide was used instead of diphenyl sulfide in Step (1) of Synthesis Example 2. The measurement result of the photoactive compound represented by Formula 6 using ¹H-NMR is as follows.

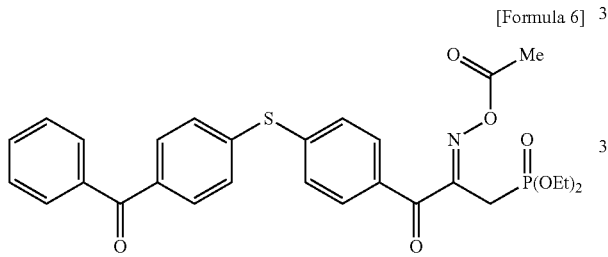

[Formula 6]

1H NMR (500 MHz, CDCl₃, ppm): 8.05-7.99 (2H, d, ArH), 7.82-7.74 (4H, m, ArH), 7.62-7.56 (1H, m, ArH), 7.53-7.44 (4H, m, ArH), 7.38-7.33 (2H, d, ArH), 4.15-4.00 (4H, m, 2OCH₂), 3.57 (2H, d, CH₂), 2.25 (3H, s, OCH₃), 1.18-1.07 (6H, m, 2CH₃).

Experimental Example 1

The melting points of the compounds in the following Table 1 were measured using DSC equipment, and the results thereof are shown in Table 1.

TABLE 1

| Compound | Melting Point |
| --- | --- |
| Formula 3 | 104° C. |
| Formula 3 (cont.) | 42° C. |
| Comparative Compound 1 (OXE-01, BASF Corporation) | |
| Comparative Compound 2 (Korean Patent Application Laid-Open Publication No. 10-2011-7015885) | 84° C. |

As shown in Table 1, the photoactive compound including the phosphonate structure according to the present invention is more stable than existing compounds having similar structures (Comparative Compounds 1 and 2) due to its higher melting point, and additionally, is also simpler to handle.

Example 1

Preparation of Colored Photosensitive Resin Composition

The photosensitive resin composition was prepared by mixing 8 parts by weight of the alkali-soluble acrylic-based binder {benzyl methacrylate/N-phenylmaleimide/styrene/methacrylic acid (molar ratio 60/10/12/18, Mw=10000, 80 KOH mg/g)}, 43 to 49 parts by weight of a green millbase made of C.I. PIGMENT Green 58 and C.I. PIGMENT Yellow 139, 16 parts by weight of dipentaerythritol hexaacrylate as the polymerizable compound, 2.0 parts by weight of the compound of Formula 3, prepared in Synthesis Example 1, as the photopolymerization initiator, and 27 to 33 parts by weight of propylene glycol monomethyl ether acetate (PGMEA) as the organic solvent for 3 hours using a shaker.

Example 2

Preparation of Colored Photosensitive Resin Composition

The photosensitive resin composition was prepared in the same manner as in Example 1, except that the compound of Formula 4 prepared in Synthesis Example 2 was used, instead of the compound of Formula 3 prepared in Synthesis Example 1 of Example 1.

Comparative Example 1

The photosensitive resin composition was prepared in the same manner as in Example 1, except that OXE-02 compound, manufactured by BASF Corporation, was used instead of the compound of Formula 3 prepared in Synthesis Example 1 of Example 1.

Comparative Example 2

The photosensitive resin composition was prepared in the same manner as in Example 1, except that the compound of Formula 7, described in the example in Korean Patent Application Laid-Open Publication No. 10-2010-0092904, was used instead of the compound of Formula 3 prepared in Synthesis Example 1 of Example 1.

Experimental Example 2

After the prepared photosensitive resin composition was spin-coated on glass, a suitable amount of the solvent was removed through a process of pre-baking (i.e. soft baking) for 100 seconds at 100° C. After the coated glass was exposed using an i-line exposure device, it was developed in a developing solution in which potassium hydroxide (KOH) was diluted, and after it was post-baked (i.e. hard baked) for 20 minutes in an oven at 230° C., the color and the brightness of the formed pattern were measured, and the results are shown in the following Table 2.

TABLE 2

| | Photopolymerization Initiator Used | Brightness (at Gx = 0.294, Gy = 0.600) |
|---|---|---|
| Example 1 | Formula 3 | 57.5 |
| Example 2 | Formula 4 | 57.3 |
| Comparative Example 1 | Comparative Compound 3 (OXE-02, BASF Corporation) | 56.9 |
| Comparative Example 2 | Comparative Compound 4 (Korean Patent Application Laid-Open Publication No. 10-2010-0092904) | 56.2 |

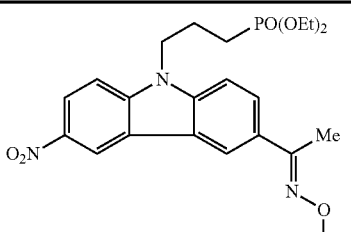

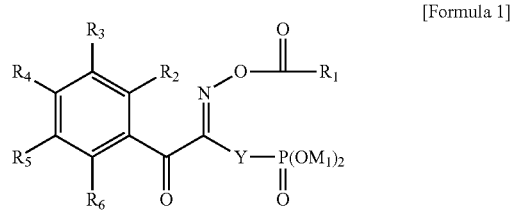

As shown in Table 2, the photoactive compound according to the present invention did not experience yellowing, and had good thermal resistance, thereby giving more excellent effects in terms of brightness compared with when existing photoactive compounds were used.

What is claimed is:

1. A photoactive compound represented by Formula 1,

[Formula 1]

wherein, in Formula 1,

Y is a $C_1$-$C_{15}$ alkylene group unsubstituted or substituted with one or more substituents selected from the group consisting of R, OR, SR, COR and OCOR, $M_1$ is a $C_1$-$C_8$ alkyl group or a $C_6$-$C_{12}$ aryl group, $R_1$ is a $C_1$-$C_8$ alkyl group or a $C_6$-$C_{12}$ aryl group, at least one of $R_2$ to $R_6$ is XA, and the rest are each independently selected from the group consisting of a halogen group, CN, R, OR, SR, COR, OCOR, NRR' and CONRR', X is directly linked; or selected from the group consisting of C=O, O, S, S=O, and $SO_2$, A is a $C_6$-$C_{20}$ aryl group unsubstituted or substituted with one or more substituents selected from the group consisting of a halogen group, CN, R, OR, SR, COR, OCOR, NRR' and CONRR', R and R' are each independently selected from the group consisting of hydrogen, a $C_1$-$C_{10}$ alkyl group, a $C_1$-$C_{10}$ haloalkyl group and a $C_7$-$C_{13}$ arylalkyl group, or R and R' may form a ring together.

2. The photoactive compound of claim 1, wherein Formula 1 is Formula 2,

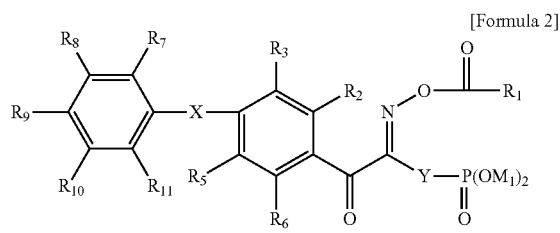

[Formula 2]

wherein, in Formula 2,
Y is a $C_1$-$C_{15}$ alkylene group unsubstituted or substituted with one or more substituents selected from the group consisting of R, OR, SR, COR and OCOR,
$M_1$ is a $C_1$-$C_8$ alkyl group or a $C_6$-$C_{12}$ aryl group,
$R_1$ is a $C_1$-$C_8$ alkyl group or a $C_6$-$C_{12}$ aryl group,
X is directly linked, or selected from the group consisting of C=O, O, S, S=O, and $SO_2$,
$R_2$, $R_3$, $R_5$, $R_6$, $R_7$, $R_8$, $R_9$, $R_{10}$ and $R_{11}$ are each independently selected from the group consisting of a halogen group, CN, R, OR, SR, COR, OCOR, NRR' and CONRR',
R and R' are each independently selected from the group consisting of hydrogen, a $C_1$-$C_{10}$ alkyl group, a $C_1$-$C_{10}$ haloalkyl group and a $C_7$-$C_{13}$ arylalkyl group, or R and R' may form a ring together.

3. The photoactive compound of claim 1, wherein Formula 1 is any one of Formulae 3 to 6,

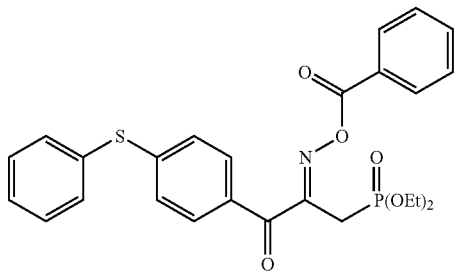

[Formula 3]

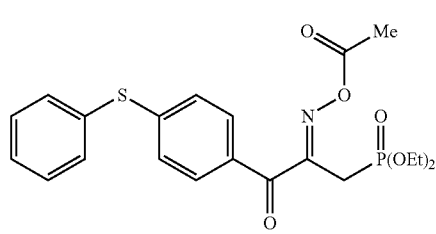

[Formula 4]

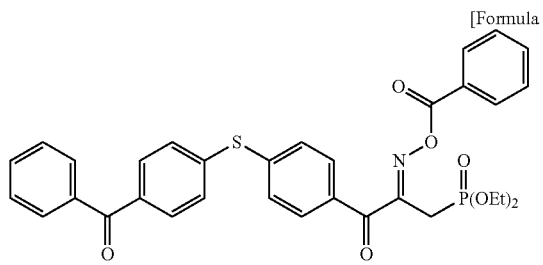

[Formula 5]

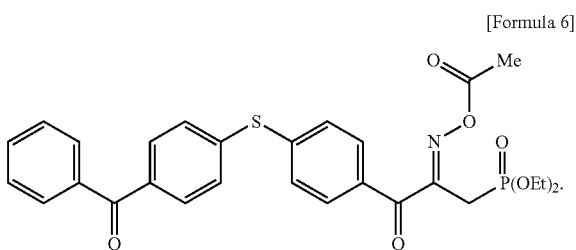

[Formula 6]

4. A photosensitive resin composition comprising:
the photoactive compound represented by Formula 1;
an alkali-soluble binder resin;
a polymerizable compound including an ethylenic unsaturated bond; and
a solvent,

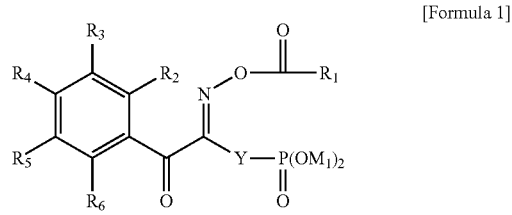

[Formula 1]

wherein, in Formula 1,
Y is a $C_1$-$C_{15}$ alkylene group unsubstituted or substituted with one or more substituents selected from the group consisting of R, OR, SR, COR and OCOR,
$M_1$ is a $C_1$-$C_8$ alkyl group or a $C_6$-$C_{12}$ aryl group,
$R_1$ is a $C_1$-$C_8$ alkyl group or a $C_6$-$C_{12}$ aryl group,
at least one of $R_2$ to $R_6$ is XA, and the rest are each independently selected from the group consisting of a halogen group, CN, R, OR, SR, COR, OCOR, NRR' and CONRR',
X is directly linked, or selected from the group consisting of C=O, O, S, S=O, and $SO_2$,
A is a $C_6$-$C_{20}$ aryl group unsubstituted or substituted with one or more substituents selected from the group consisting of a halogen group, CN, R, OR, SR, COR, OCOR, NRR' and CONRR',
R and R' are each independently selected from the group consisting of hydrogen, a $C_1$-$C_{10}$ alkyl group, a $C_1$-$C_{10}$ haloalkyl group and a $C_7$-$C_{13}$ arylalkyl group, or R and R' may form a ring together.

5. The photosensitive resin composition of claim 4, wherein Formula 1 is Formula 2,

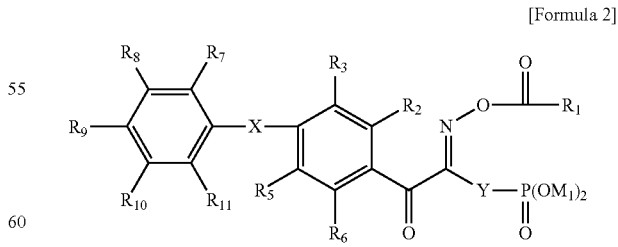

[Formula 2]

wherein, in Formula 2,
Y is a $C_1$-$C_{15}$ alkylene group unsubstituted or substituted with one or more substituents selected from the group consisting of R, OR, SR, COR and OCOR,
$M_1$ is a $C_1$-$C_8$ alkyl group or a $C_6$-$C_{12}$ aryl group, R₁ is a $C_1$-$C_8$ alkyl group or a $C_6$-$C_{12}$ aryl group, X is directly linked, or selected from the group consisting of C=O, O, S, S=O, and $SO_2$, $R_2$, $R_3$, $R_5$, $R_6$, $R_7$, $R_8$, $R_9$, $R_{10}$ and $R_{11}$ are each independently selected from the group consisting of a halogen group, CN, R, OR, SR, COR, OCOR, NRR' and CONRR', R and R' are each independently selected from the group consisting of hydrogen, a $C_1$-$C_{10}$ alkyl group, a $C_1$-$C_{10}$ haloalkyl group and a $C_7$-$C_{13}$ arylalkyl group, or R and R' may form a ring together.

6. The photosensitive resin composition of claim 4, wherein Formula 1 is any one of Formulae 3 to 6,

[Formula 3]

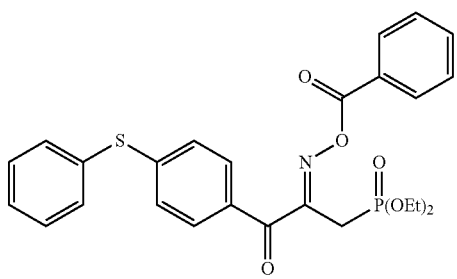

[Formula 4]

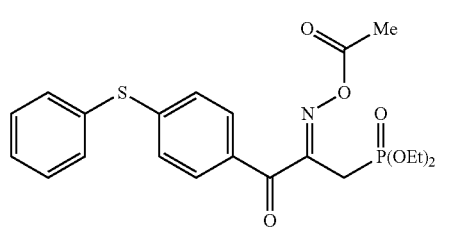

[Formula 5]

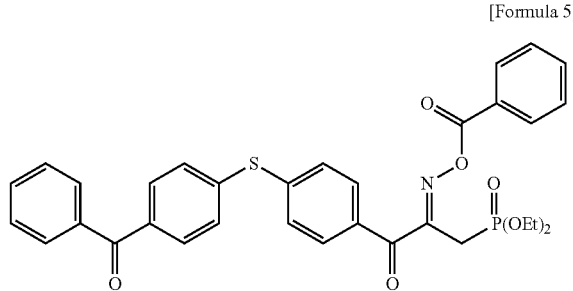

[Formula 6]

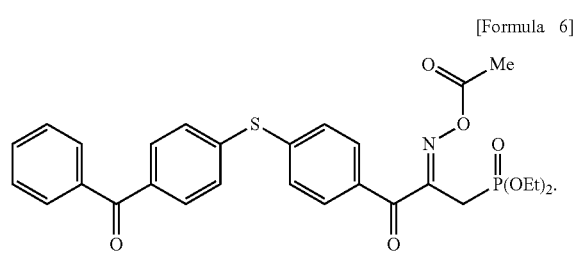

7. The photosensitive resin composition of claim 4, wherein an acid value of the alkali-soluble binder resin ranges from 30 to 300 KOH mg/g.

8. The photosensitive resin composition of claim 4, wherein a weight average molecular weight of the alkali-soluble binder resin ranges from 1,000 to 200,000.

9. The photosensitive resin composition of claim 4, wherein a content of the photoactive compound of Formula 1 ranges from 0.1 to 5% by weight based on a total weight of the photosensitive resin composition.

10. The photosensitive resin composition of claim 4, wherein a content of the alkali-soluble binder resin ranges from 1 to 30% by weight based on a total weight of the photosensitive resin composition.

11. The photosensitive resin composition of claim 4, wherein a content of the polymerizable compound including an ethylenic unsaturated bond ranges from 0.5 to 30% by weight based on a total weight of the photosensitive resin composition.

12. The photosensitive resin composition of claim 4, wherein a content of the solvent ranges from 40 to 95% by weight based on a total weight of the photosensitive resin composition.

13. The photosensitive resin composition of claim 4, further comprising:

a coloring agent.

14. The photosensitive resin composition of claim 13, wherein a content of the coloring agent ranges from 1 to 20% by weight based on a total weight of the photosensitive resin composition.

15. The photosensitive resin composition of claim 4, further comprising:

a second photoactive compound.

16. The photosensitive resin composition of claim 15, wherein a content of the second photoactive compound ranges from 0.1 to 5% by weight based on a total weight of the photosensitive resin composition.

17. The photosensitive resin composition of claim 4, further comprising:

one, two or more additives selected from the group consisting of a curing accelerator, a thermal polymerization inhibitor, a dispersant, an antioxidant, a UV absorber, a leveling agent, a photosensitizer, a plasticizer, an adhesion accelerator, a filler and a surfactant.

18. The photosensitive resin composition of claim 17, wherein a content of each additive ranges from 0.01 to 5% by weight based on a total weight of the photosensitive resin composition.

19. A photosensitive material prepared using the photosensitive resin composition of any one of claims 4 to 18.

20. The photosensitive material of claim 19, wherein the photosensitive material is selected from the group consisting of pigment dispersion type photosensitive material for manufacturing a TFT LCD color filter, photosensitive material for forming a black matrix of a TFT LCD or forming a black matrix of an organic light emitting diode, photosensitive material for forming an overcoat layer, column spacer photosensitive material, and photosensitive material for printed circuit boards.

21. An electronic device comprising the photosensitive material of any one of claims 19 to 18.

* * * * *

UNITED STATES PATENT AND TRADEMARK OFFICE
CERTIFICATE OF CORRECTION

PATENT NO. : 8,883,398 B2  
APPLICATION NO. : 14/347165  
DATED : November 11, 2014  
INVENTOR(S) : Changho Cho et al.

It is certified that error appears in the above-identified patent and that said Letters Patent is hereby corrected as shown below:

In the claims

In claim 19 at column 24, line 54, replace "any one of claims 4 to 18" with -- claim 4 --.

Column 24, lines 55-62, cancel claim 20.

In claim 21 at column 24, line 64, replace "any one of claims 19 to 18" with -- claim 19 --.

Signed and Sealed this
Eighth Day of December, 2015

Michelle K. Lee
*Director of the United States Patent and Trademark Office*